US007592032B2

(12) United States Patent
Miyasaka

(10) Patent No.: US 7,592,032 B2
(45) Date of Patent: Sep. 22, 2009

(54) METHOD OF RECOGNIZING IMAGE OF NOZZLE HOLE AND METHOD OF CORRECTING POSITION OF LIQUID DROPLET EJECTION HEAD USING THE SAME; METHOD OF INSPECTING NOZZLE HOLE; APPARATUS FOR RECOGNIZING IMAGE OF NOZZLE HOLE AND LIQUID DROPLET EJECTION APPARATUS EQUIPPED WITH THE SAME; METHOD OF MANUFACTURING ELECTRO-OPTICAL DEVICE; ELECTRO-OPTICAL DEVICE; AND ELECTRONIC EQUIPMENT

(75) Inventor: Yoichi Miyasaka, Suwa (JP)

(73) Assignee: Seiko Epson Corporation (JP)

( * ) Notice: Subject to any disclaimer, the term of this patent is extended or adjusted under 35 U.S.C. 154(b) by 1127 days.

(21) Appl. No.: 10/789,934

(22) Filed: Feb. 27, 2004

(65) Prior Publication Data

US 2005/0046656 A1 Mar. 3, 2005

(30) Foreign Application Priority Data

Feb. 28, 2003 (JP) ............................ 2003-052970

(51) Int. Cl.
*C23C 16/52* (2006.01)
*B05D 5/00* (2006.01)
*B41J 29/393* (2006.01)

(52) U.S. Cl. .......................... 427/8; 427/58; 427/427.1; 427/427.3; 347/19

(58) Field of Classification Search ..................... 427/8, 427/58; 347/19
See application file for complete search history.

(56) References Cited

U.S. PATENT DOCUMENTS

| | | | |
|---|---|---|---|
| 6,830,855 | B2 | 12/2004 | Kiguchi et al. |
| 6,998,208 | B2 | 2/2006 | Kiguchi et al. |

FOREIGN PATENT DOCUMENTS

| | | | |
|---|---|---|---|
| CN | 1393704 A | | 1/2003 |
| JP | 10-044399 | | 2/1998 |
| JP | 2000-334965 A | * | 5/2000 |

OTHER PUBLICATIONS

Communication from Korean Patent Office re: related application.
Communication from Chinese Patent Office re: related application (with translation).

* cited by examiner

*Primary Examiner*—Shamin Ahmed
(74) *Attorney, Agent, or Firm*—Harness, Dickey & Pierce, P.L.C.

(57) ABSTRACT

In a nozzle hole image recognition method for picturing a nozzle hole of a liquid droplet ejection head which is filled with a function liquid and then performing image recognition thereof, the nozzle hole is pictured synchronously with application, to the liquid droplet ejection head, of a driving waveform which causes single-period micromotion of a meniscus surface of the nozzle hole. Thus, it is possible to provide: the nozzle hole image recognition method in which the image of the nozzle hole is recognized at a good accuracy in a state in which the liquid droplet ejection head is filled with the function liquid and a position correction method of a liquid droplet ejection head using it; a nozzle hole inspection method; a nozzle hole image recognition apparatus; and a liquid droplet ejection apparatus equipped therewith.

4 Claims, 12 Drawing Sheets

METHOD OF RECOGNIZING IMAGE OF NOZZLE HOLE AND METHOD OF CORRECTING POSITION OF LIQUID DROPLET EJECTION HEAD USING THE SAME; METHOD OF INSPECTING NOZZLE HOLE; APPARATUS FOR RECOGNIZING IMAGE OF NOZZLE HOLE AND LIQUID DROPLET EJECTION APPARATUS EQUIPPED WITH THE SAME; METHOD OF MANUFACTURING ELECTRO-OPTICAL DEVICE; ELECTRO-OPTICAL DEVICE; AND ELECTRONIC EQUIPMENT

BACKGROUND OF THE INVENTION

1. Field of the Invention

This invention relates to: a method of recognizing an image of a nozzle hole for picturing a nozzle hole in which a nozzle hole of a liquid droplet ejection head as represented by an ink jet head is pictured and is subjected to recognition by means of image and the like, and a method of correcting the position of the liquid droplet ejection head by using the same; a method of inspecting a nozzle hole; an apparatus for recognizing an image of a nozzle hole and an apparatus for ejecting a liquid droplet equipped with the same; a method of manufacturing an electro-optical device; an electro-optical device; and an electronic equipment.

2. Description of the Related Art

In a liquid droplet ejection apparatus which supplies a function liquid from a function liquid supply system to a liquid droplet ejection head mounted on a carriage, such as a color filter deposition apparatus to which an ink jet method is applied, the liquid droplet ejection head needs to be replaced, because the life of the liquid droplet ejection head itself becomes short depending on the properties of the function liquid and the like. However, when the liquid droplet ejection head is replaced, there is a limit of mechanical accuracy in stably maintaining high positional accuracy (attaching accuracy) of the liquid droplet ejection head relative to the carriage.

Therefore, conventionally, the following measure has been taken using a nozzle hole image recognition method, i.e., after a liquid droplet ejection head is attached to a carriage, nozzle holes are pictured by a recognition camera with a strobe, and the positions of the nozzle holes are recognized through the image and, finally, positional deviation of the liquid droplet ejection head is corrected on data. In this case, in consideration of accuracy, the liquid droplet ejection head is moved to a fixed position of a recognition camera through the carriage, and two outermost nozzle holes are imaged.

This kind of conventional method is used in a state in which the liquid droplet ejection head is not filled with the function liquid yet. The function liquid supply system is connected to the liquid droplet ejection head after data correction. In this case, however, a piping member is manually attached to an adapter of the liquid droplet ejection head. Therefore, there has been a possibility that the attaching position of the liquid droplet ejection head may slightly deviate. Thus, in reality, for example, an image recognition operation is conducted again for checking, and thus a series of replacement operations are complicated and is not swift enough.

Considering the above problems, it is originally preferred that the nozzle hole image recognition operation be conducted after the function liquid supply system is connected to the liquid droplet ejection head. However, in a state in which the liquid droplet ejection head is filled with the function liquid, projections and recesses of the meniscus surfaces of the nozzle holes (surfaces of the function liquid formed on the ejection side of the nozzle holes) become non-uniform due to inertia accompanied by the movement of the liquid droplet ejection head and pressure fluctuations within piping of the function liquid supply system. As a result, irregular irradiation occurs in the taken images, affecting accuracy of image recognition.

SUMMARY OF THE INVENTION

It is an object of this invention to provide a nozzle hole image recognition method in which image recognition and the like of a nozzle hole can be performed with good accuracy in a state of being filled with a function liquid, and a position correction method of a liquid droplet ejection head using the same, a nozzle hole inspection method, an nozzle hole image recognition apparatus and a liquid droplet ejection apparatus equipped with the same, a method of manufacturing an electro-optical device, an electro-optical device and an electronic equipment.

A method of recognizing an image of a nozzle hole according to this invention comprises picturing a nozzle hole of a liquid droplet ejection head in a state of being filled with a function liquid to thereby perform image recognition thereof, wherein the nozzle hole is pictured synchronously with application of a driving waveform to the liquid droplet ejection head, the driving waveform causing single-period micromotion of a meniscus surface of the nozzle hole.

In this case, preferably, the picturing is performed by causing a strobe to emit light to the nozzle hole.

Similarly, an apparatus for recognizing an image of a nozzle hole, according to this invention, in which a nozzle hole is pictured in a state of being filled with a function liquid to thereby perform image recognition thereof, comprises: a strobe for irradiating the nozzle hole with picturing light; a recognition camera for picturing the nozzle hole irradiated by the strobe; a head driver for applying a driving waveform to the liquid droplet ejection head, the driving waveform causing single-period micromotion of a meniscus surface of the nozzle hole; and a strobe driver for causing the strobe to emit light synchronously with application of the driving waveform to the liquid droplet ejection head.

According to the above arrangement, single-period micromotion of the meniscus surface of the nozzle hole is caused by the driving waveform applied to the liquid droplet ejection head, without ejecting the function liquid from the nozzle hole. Thus, the meniscus surface is shifted to a predetermined position, and the nozzle hole in this state can be irradiated with natural light or by strobe, and pictured.

Accordingly, the nozzle hole can be pictured under the same conditions. Thus, for example, by establishing in advance an image processing step in consideration of certain irregular irradiation on the meniscus surface, irregular irradiation on the meniscus surface is adequately absorbed in the image processing after picturing, thereby appropriately recognizing the nozzle hole. Alternatively, an influence of the meniscus surface can be eliminated by setting the "same conditions" to realize a state of the meniscus surface in which irregular irradiation can be initially avoided. Thus, the nozzle hole is appropriately recognized without requiring complicated image processing. In addition, the head driver makes it possible to do away with the necessity of generating timing data exclusively used for light emission by the strobe.

In the above case, preferably, the picturing is performed at a timing in which the meniscus surface is pulled into an inside of the nozzle hole due to the driving waveform.

In a similar manner, preferably, the driving waveform is a waveform which pulls the meniscus surface into an inside of the nozzle hole, and the strobe driver causes the strobe to emit light at a timing in which the meniscus surface is pulled into the inside of the nozzle hole.

According to the above arrangement, irregular irradiation of the meniscus surface does not occur. Therefore, an influence of the meniscus surface is completely eliminated irrespective of a movement of the liquid droplet ejection head. Thus, the nozzle hole is appropriately and quickly recognized by simple image processing. In addition, presence or absence of a foreign matter (for example, solidified solvent within the function liquid) adhered to a portion of the nozzle hole on the ejection side thereof can be easily detected. This arrangement can thus be used for inspection of a nozzle with poor ejection.

In the above-described cases, preferably, the recognition camera is fixed to a position facing a nozzle surface of the liquid droplet ejection head.

According to the above arrangement, positional deviation of the recognition camera accompanied by the movement thereof can be eliminated, and the shape of the nozzle hole can be surely recognized without an error.

A method of correcting a position of a liquid droplet ejection head according to this invention comprises: the step of recognizing an image of a position of a nozzle hole of a liquid droplet ejection head by using the above-described method of recognizing an image of a nozzle hole; and the step of correcting positional data of the liquid droplet ejection head based on a result of recognition in the recognizing step.

A liquid droplet ejection apparatus, according to this invention, for selectively ejecting a function liquid from a nozzle hole while moving the liquid droplet ejection head relative to a workpiece comprises: the above-described apparatus for recognizing an image of a nozzle hole nozzle hole; storage means for storing positional data of the liquid droplet ejection head, wherein the positional data is data as corrected based on a result of recognition of a position of the nozzle hole by the apparatus for recognizing an image of a nozzle hole.

According to the above arrangement, when, for example, the liquid droplet ejection head is replaced in the liquid droplet ejection apparatus, the image of the position of the nozzle hole is recognized by using the above-described nozzle hole image recognition method/apparatus. Thereafter, the positional data is corrected based on the result of image recognition so that the position of the nozzle hole meets a desired design position (reference position). Thus, the positional correction of the liquid droplet ejection head can be performed at a high accuracy and quickly. In addition, the liquid droplet ejection head whose position has been corrected can eject the function liquid accurately onto a target position on the workpiece.

A method of inspecting a nozzle hole according to this invention comprises picturing a nozzle hole of a liquid droplet ejection head in a state of being filled with a function liquid to thereby check presence or absence of a foreign matter adhered thereto, wherein the nozzle hole is pictured at a timing when a driving waveform is applied to the liquid droplet ejection head, the driving waveform being such that a meniscus surface of the nozzle hole is pulled inside.

According to the above arrangement, the meniscus surface can be shifted so as to be positioned inside the nozzle hole without ejecting the function liquid from the nozzle hole, and the nozzle hole is pictured in this state. Therefore, the image to be pictured includes a portion of the nozzle hole on the ejection side thereof, exposed as a result of pulling the meniscus surface. Thus, by observation or image processing of the pictured image, presence or absence of the foreign matter (for example, solidified solvent within the function liquid) attached to the portion of the nozzle hole on the ejection side thereof can be easily inspected.

When a foreign matter is found, the foreign matter can be removed by performing suction processing to the liquid droplet ejection head (forcible discharge of the function liquid through the nozzle hole) or flushing (waste ejection of the function liquid). If the foreign matter cannot be removed, the nozzle hole is set not to eject the function liquid, or the liquid droplet ejection head is replaced.

In this case, preferably, the liquid droplet ejection head has a plurality of the nozzle heads, and the method further comprises: the step of ejecting, for inspection, a function liquid from all of nozzle holes of the liquid droplet ejection head toward an inspection area; the step of determining a defective nozzle for determining a nozzle hole with poor ejection, based on a result of ejection in the inspection area, wherein, after the step of determining the defective nozzle, the nozzle hole with poor ejection is pictured as a nozzle hole to be made an object of inspection, by applying the driving waveform to the liquid droplet ejection head.

According to the above arrangement, the function liquid is first ejected from all of the nozzles onto the inspection area, since inspection by picturing all of the nozzles is inefficient in terms of time. The nozzle hole which is thereby determined to have caused defective ejection based on the result of ejection is made to be an object of the inspection by picturing. Thus, inspection of all of the nozzle holes can be effectively conducted.

A method of manufacturing an electro-optical device according to this invention comprises ejecting a function liquid from the liquid droplet ejection head by using the above-described liquid droplet ejection apparatus to thereby form a deposition portion on a substrate serving as a workpiece.

An electro-optical device according to this invention comprises a deposition portion formed on a substrate serving as a workpiece, the deposition portion being formed by a function liquid ejected from the liquid droplet ejection head by using the above-described liquid droplet ejection apparatus.

According to the above arrangement, the deposition process is performed by using the above-described liquid droplet ejection apparatus. Thus, the yield of the electro-optical device can be improved. As the electro-optical device, a liquid crystal display device, an organic electro-luminescence (EL) device, an electron-emitting device, a plasma display panel (PDP) device, an electrophoretic display device and the like can be considered. The electron-emitting device conceptually includes a so-called field emission display (FED) device. Further, the electro-optical device includes a device in which metal wiring, a lens, resist, light diffuser and the like is formed.

Electronic equipment according to this invention has mounted thereon the above-described electro-optical device.

According to the above arrangement, electronic equipment having mounted thereon the high-quality electro-optical device can be provided. In this case, a cellular phone and a personal computer, each having mounted thereon a so-called flat panel display, as well as various electric products correspond to the electronic equipment.

BRIEF DESCRIPTION OF THE DRAWINGS

FIGS. 1A and 1B are views schematically showing a basic arrangement of a liquid droplet ejection apparatus according to one embodiment of this invention, in which FIG. 1A is a plan view thereof and FIG. 1B is a front view thereof;

FIGS. 2A and 2B are views showing a liquid droplet ejection head, in which FIG. 2A is a perspective view thereof and FIG. 2B is an enlarged cross sectional view of a vicinity of a nozzle hole thereof;

FIGS. 4A and 4B are views schematically showing driving waveforms applied to the liquid droplet ejection head, in which FIG. 4A shows an ejection waveform and FIG. 4B shows a micro-vibration waveform;

FIGS. 5A and 5B are explanatory views for explaining an influence of a meniscus surface in case where the micro-vibration waveform is not applied, in which FIG. 5A is a cross sectional view of a vicinity of the nozzle hole and FIG. 5B is a schematic view of an imaged picture thereof;

FIGS. 6A and 6B are explanatory views for explaining an influence of the meniscus surface in case where the micro-vibration waveform is applied, in which FIG. 6A is a cross sectional view of the vicinity of the nozzle hole and FIG. 6B is a schematic view of an imaged picture thereof;

FIGS. 10A to 10C are views for explaining a nozzle hole inspection method according to the embodiment, in which FIG. 10A is a plan view showing a result of ejection to an inspection area, FIG. 10B is a schematic view of an imaged picture in case where the micro-vibration waveform is not applied, and FIG. 10C is a schematic view of an image picture in case where the micro-vibration waveform is applied;

DETAILED DESCRIPTION OF THE PREFERRED EMBODIMENT

A liquid droplet ejection apparatus according to one embodiment of this invention is described hereinbelow with reference to the accompanying drawings. The liquid droplet ejection apparatus is incorporated in a manufacturing line of a flat panel display such as an organic EL device and the like. The liquid droplet ejection apparatus performs drawing by selectively ejecting function liquid droplets, such as a luminescent material and the like, from nozzle holes of a liquid droplet ejection head to a substrate (workpiece), thus forming a desired deposition portion on the substrate. Further, a nozzle hole image recognition apparatus for picturing the nozzle holes and performing image recognition is incorporated in the liquid droplet ejection apparatus in a state in which the liquid droplet ejection head is filled with a function liquid.

Figure 1A:
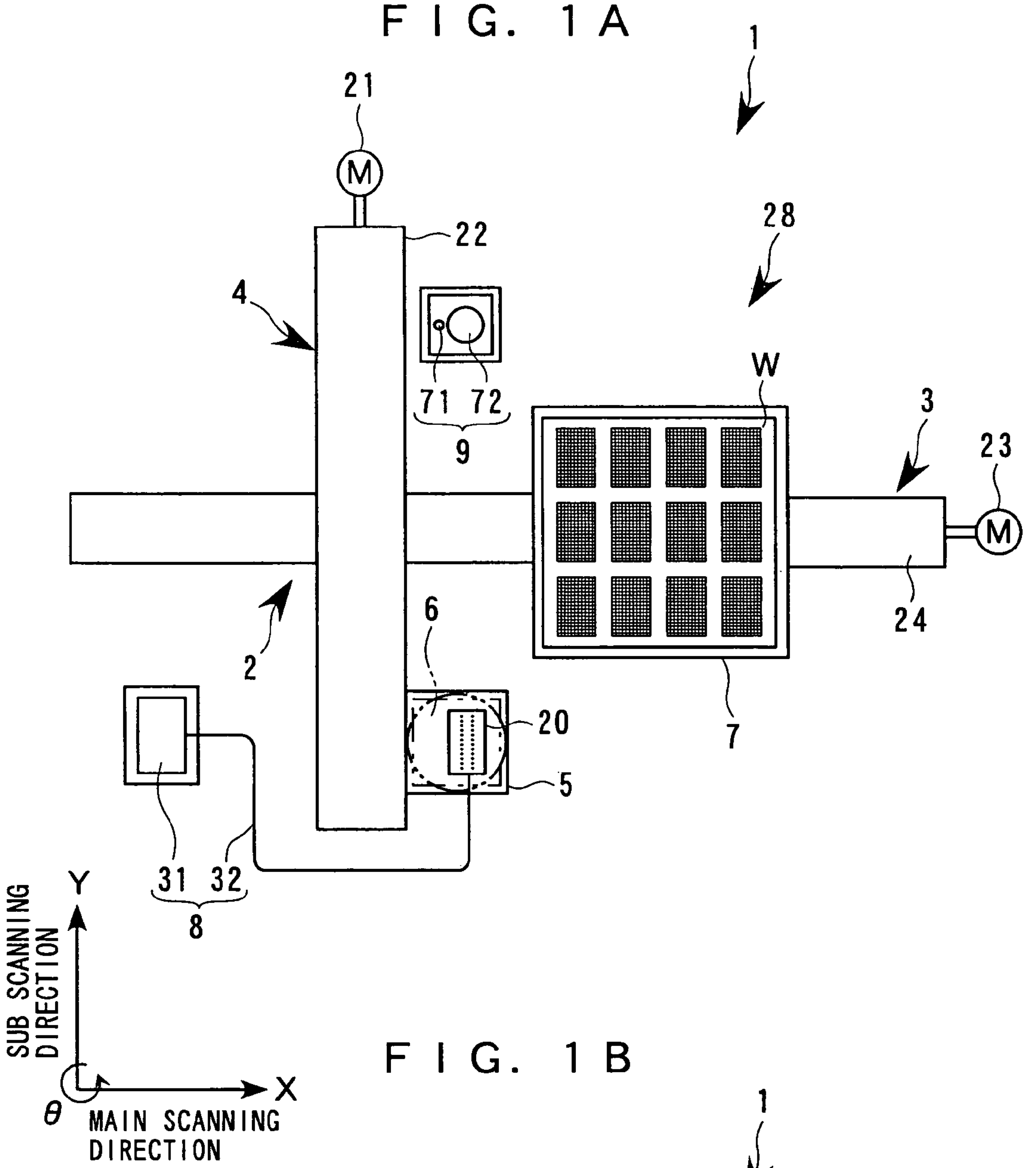
Figure 1B:
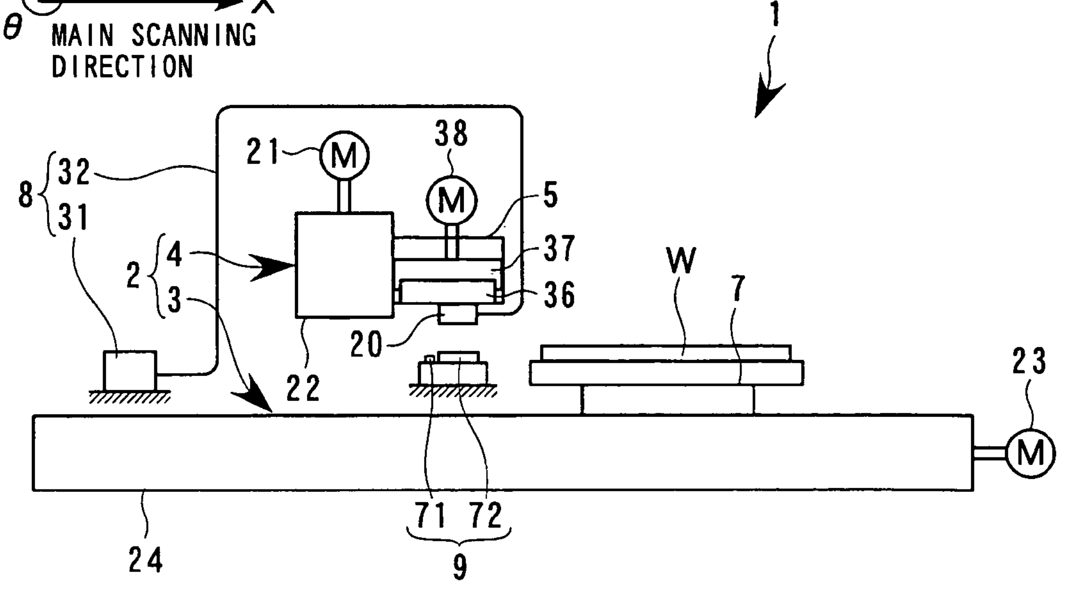

FIGS. 1A and 1B are schematic views showing a basic arrangement of the liquid droplet ejection apparatus. As shown in these figures, the liquid droplet ejection apparatus 1 comprises an X•Y moving mechanism 2 made up of an X-axis table 3 and a Y-axis table 4 disposed on a stand (not illustrated), and a main carriage 5 movably attached to the Y-axis table 4. The main carriage 5 holds a head unit 6 on which a liquid droplet ejection head 20 ejecting a function liquid is mounted. A substrate W which is a workpiece is constituted, e.g., by a glass substrate or a polyimide substrate, and is set on a workpiece table 7 movably attached to the X-axis table 3.

In addition, incorporated in the liquid droplet ejection apparatus 1 are: a function liquid supply mechanism 8 which supplies the liquid droplet ejection head 20 with a function liquid; an image recognition unit 9 which pictures nozzle holes 53 of the liquid droplet ejection head 20 and performs image recognition thereof; and a controller 10 (a control section 83, see FIG. 3) which controls various components including the above-described X•Y moving mechanism 2, the liquid droplet ejection head 20, the image recognition unit 9 and the like. Further, although not illustrated, a suction unit for sucking the function liquid from the liquid droplet ejection head 20 through the nozzle holes 53, and a flushing unit which receives periodical flushing (waste ejection of the function liquid from all nozzle holes 53) of the liquid droplet ejection head 20 are incorporated into the liquid droplet ejection apparatus 1.

The X•Y moving mechanism 2 is a so-called two-axis robot of X•Y axes, and the X-axis table 3 is positioned under the Y-axis table 4. The X-axis table 3 has an X-axis slider 24 in which a pulse-driven linear motor 23 is built, and is constituted by mounting the workpiece table 7 on the X-axis slider 24 so as to be movable in the X-axis direction. Namely, the X-axis table 3 moves the substrate W in the X-axis direction through the worktable 7.

The Y-axis table 4 has a Y-axis slider 22 in which a pulse-driven liner motor 21 is built, and is constituted by mounting the main carriage 5 on the Y-axis slider 22 so as to be movable in the Y-axis direction. Namely, the Y-axis table 4 moves the liquid droplet ejection head 20 in the Y-axis direction through the main carriage 5. The liquid droplet ejection head 20 is moved by the X•Y moving mechanism 2 constituted as above, in the X•Y axis directions relative to the substrate W, and drawing on the substrate W is performed by ejection of the function liquid from the liquid droplet ejection head 20.

In concrete, the liquid droplet ejection head 20 is driven to eject the function liquid synchronously with the movement of the substrate W by the X-axis table 3. So-called main scanning of the liquid droplet ejection head 20 is performed by reciprocating movement of the substrate W in the X-axis direction by the X-axis table 3. Corresponding to this movement, so-called sub scanning is performed by reciprocating movement, serving as pitch feeding motion, of the liquid droplet ejection head 20 in the Y-axis direction by the Y-axis table 4.

In this embodiment, it is so arranged that the substrate W is moved in the main scanning direction relative to the liquid droplet ejection head 20. It may, however, be so arranged that the liquid droplet ejection head 20 is moved in the main scanning direction or alternatively that the substrate W is fixed so that the liquid droplet ejection head 20 is moved in the main scanning direction and the sub scanning direction.

The function liquid supply mechanism 8 is made up of a function liquid tank 31 which stores therein the function liquid, and a supply tube 32 which connects by means of piping the function liquid tank 31 and the liquid droplet ejection head 20. The supply tube 32 is fitted into the liquid droplet ejection head 20 and is supplied with the function liquid by pressurized pumping mechanism (not illustrated) and the like, or by driving of the liquid droplet ejection head 20 for ejection. As the function liquid there is used a liquid containing materials which meet the purposes of various substrates, such as a general ink, a filter material for a color filter, a liquid metal material which functions as metal wiring after drawing, and the like.

The head unit 6 has a sub carriage 36 which positions and fixes thereto the liquid droplet ejection head 20, and a Θ-axis table 37 which causes in-planer rotation of the sub carriage 36 in the Θ-axis direction. When a Θ-axis motor 38 which serves as a power source of the Θ-axis table 37 is rotated in the forward and reverse directions of rotation, the Θ-axis table 37 causes the sub carriage 36 to rotate within the X-Y plane. Namely, by means of the Θ-axis table 37 and the Θ-axis motor 38, there is constituted a Θ-axis moving mechanism which causes angular rotation of the liquid droplet ejection head 20 relative to the substrate W.

Figure 2A:
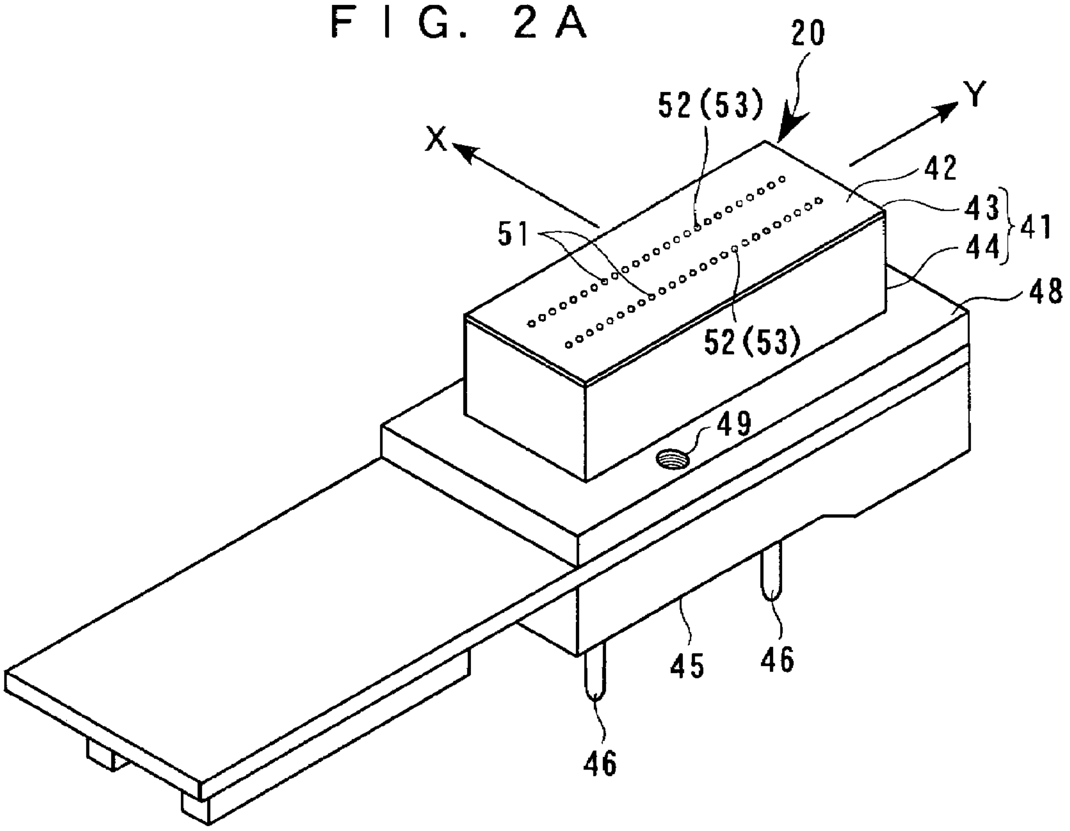
Figure 2B:
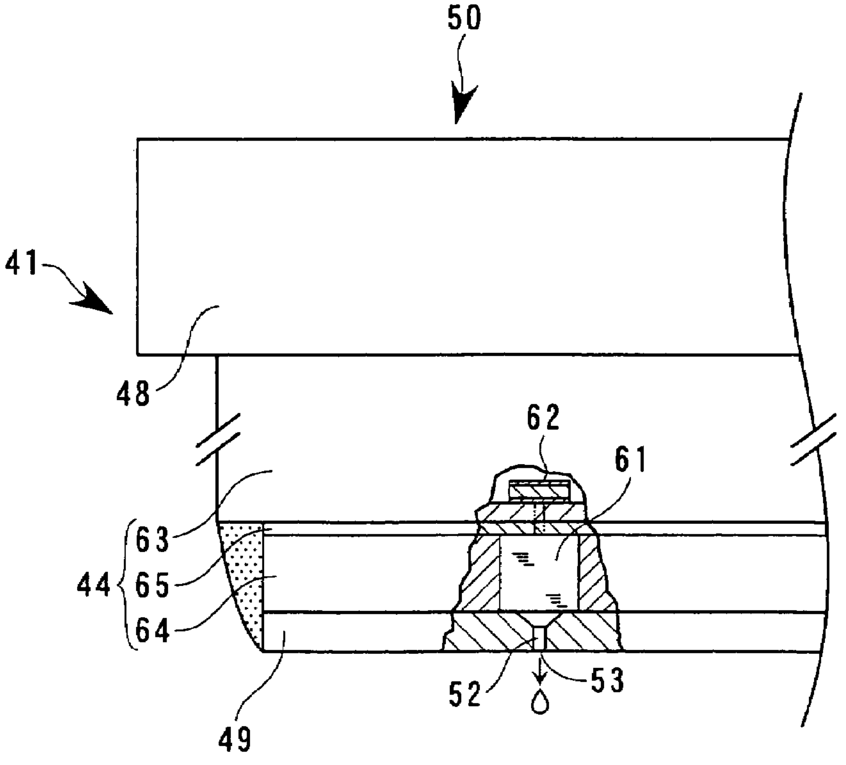

As shown in FIGS. 2A and 2B, the liquid droplet ejection head 20 is of a so-called dual type, and a head main body 41 thereof is made up of a nozzle forming plate 43 which has a nozzle surface 42, a dual pump portion 44 which is communicated with the nozzle forming plate 43, and a liquid introduction portion 45 which is communicated with an upper part of the pump portion 44. The liquid introduction portion 45 has dual connection needles 46 to which the supply tube 32 is connected. A pair of screw holes 49 (only one of them is shown in the figure) for fixing with screws the liquid droplet ejection head 20 to the sub carriage 36 is formed at diagonal positions in a rectangular flange portion 48 on the base side of the pump portion 44. The liquid droplet ejection head 20 may alternatively be fixed to a head holding member (not illustrated) with screws so that this head holding member is fixed to the sub carriage 36.

The liquid droplet ejection head 20 is fixed such that the head main body 41 projects from the lower surface of the sub carriage 36. Two nozzle rows 51 are formed in parallel with each other in the lower portion of the head main body 41, i.e., in the nozzle forming plate 43. Each nozzle row 51 is constituted by arraying, for example, 180 nozzles 52 at equal pitches in the Y-axis direction in parallel with the other row, and 360 nozzles 52 in total are arranged in a zigzag manner as a whole (see FIG. 10A). The function liquid is then ejected in a dot form from the nozzle holes 53 that are open in the nozzle surface 42.

The pump portion 44 has a pressure chamber 61 and a piezoelectric element 62 (piezo-element) whose numbers correspond to the number of the nozzles 52. Each pressure chamber 61 is in communication with the nozzle 52. The pump portion 44 has a mechanical portion 63 accommodating the piezoelectric element 62, a silicon cavity 64 to which the nozzle forming plate 43 is adhered, and a resin film 65 for joining the mechanical portion 63 and the silicon cavity 64.

The piezoelectric element 62 is displaced corresponding to a driving waveform (analog trapezoidal wave) of a drive signal applied by a later-described head driver 97 (see FIG. 3), to thereby generate pressure fluctuation within the pressure chamber 61. For example, once an “ejection waveform” (see FIG. 4A) is applied to the piezoelectric element 62, the function liquid within the pressure chamber 61 is ejected from the nozzle hole 53.

Needless to say, the number of nozzles, the number of nozzle rows, and the extension direction of the nozzle rows, of the liquid droplet ejection head 20 are not limited to those in this embodiment. For example, the liquid droplet ejection head 20 may be inclined by a predetermined angle in the same direction. Further, the number of the liquid droplet ejection head 20 is not limited to single, but may be arbitrary such as, in case of plurality of liquid droplet ejection heads 20, zigzag arrangement, stair shape arrangement and the like in arrangement pattern.

The image recognition unit 9 is fixed to that position on the pathway of movement of the liquid droplet ejection head 20 which is away from the substrate W and to the position which faces the nozzle surface 42. The image recognition unit 9 is used to correct the position of the liquid droplet ejection head 20, for example, after replacement of a deteriorated liquid droplet ejection head 20, prior to the drawing operation. The image recognition unit 9 then pictures the nozzle holes 53 of the liquid droplet ejection head 20 which has been moved to the above-described position.

The image recognition unit 9 includes a strobe 71 (LED) which irradiates the nozzle holes 53 with picturing light, and a recognition camera 72 which pictures the nozzle holes 53 irradiated by the strobe 71. The recognition camera 72 is a so-called CCD camera which acquires the nozzle holes 53 within a field of view and then pictures the same, and is provided with a CCD (picturing element) for forming images of the pictured nozzle holes 53 through a lens system. Image data of the nozzle holes 53 after photoelectric conversion by CCD is subjected to A/D conversion for outputting to a later-described image processing section 94 (see FIG. 3) by a control signal of the controller 10.

Figure 3:
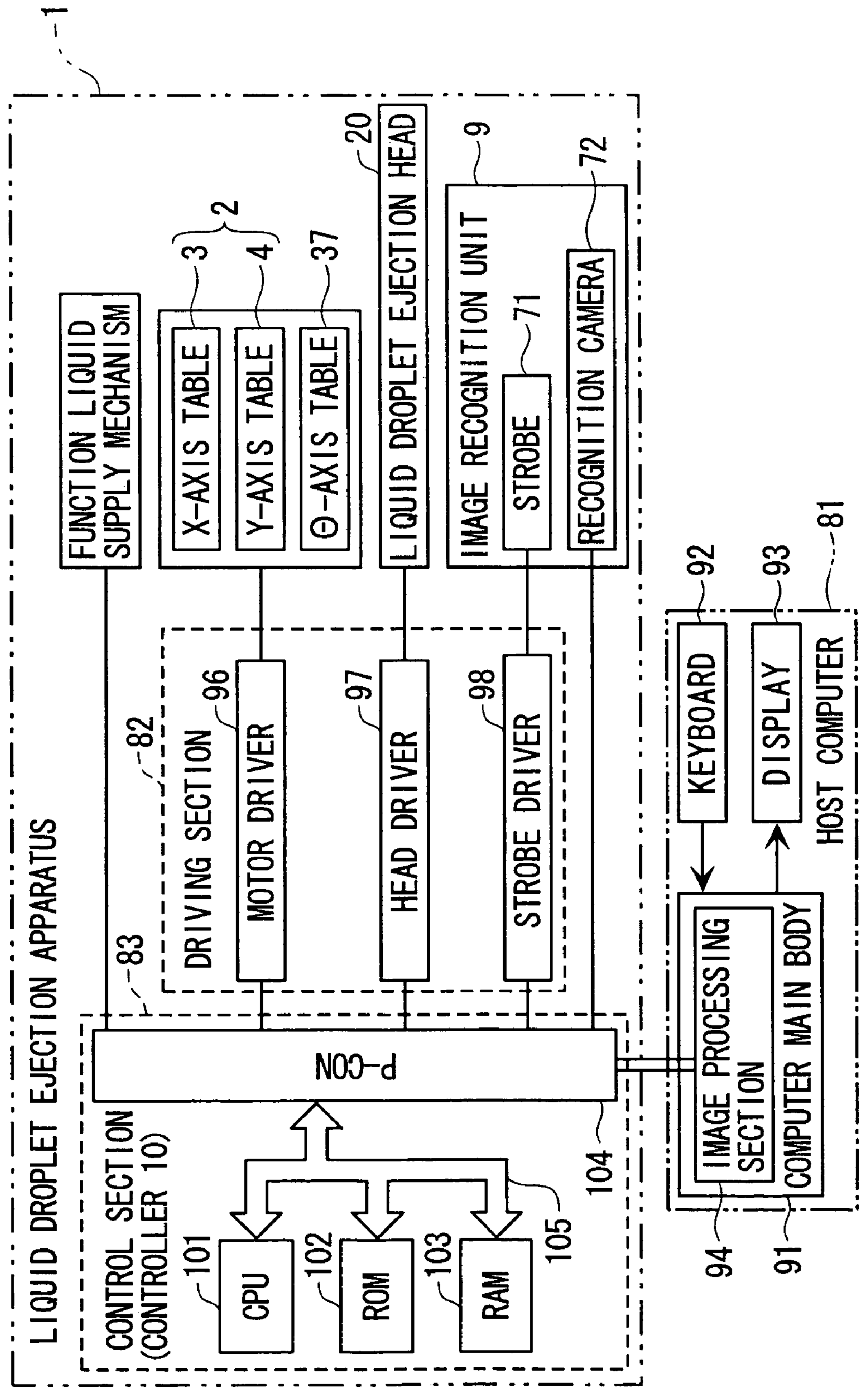
FIG. 3 is a block diagram showing a control arrangement of the liquid droplet ejection apparatus.

As shown in FIG. 3, the control system of the liquid droplet ejection apparatus 1 is basically made up of a host computer 81 such as a personal computer, a driving section 82 having various drivers for driving the liquid droplet ejection head 20, the image recognition unit 9, the X•Y moving mechanism 2 and the like, and a control section 83 (controller 10) which performs an overall control of the entire liquid droplet ejection apparatus 1 inclusive of the driving section 82.

The host computer 81 has a computer main body 91 which is connected to the control section 83. The computer main body 91 has connected thereto a key board 92, and a display 93 which display on a screen the result of inputting by the key board 92, the result of picturing by the recognition camera 72 and the like. The computer main body 91 transmits to the control section 83 the drawing data and the like for drawing on the substrate W. In addition, the computer main body 91 has the image processing section 94 which receives the image data of the nozzle holes 53 pictured by the recognition camera 72 and performs image processing thereof. In a series of image processing by the image processing section 94, for example, images of the nozzle holes 53 are multivalued, and thereafter, the positions of the nozzle holes 53 are measured.

Figure 4A:
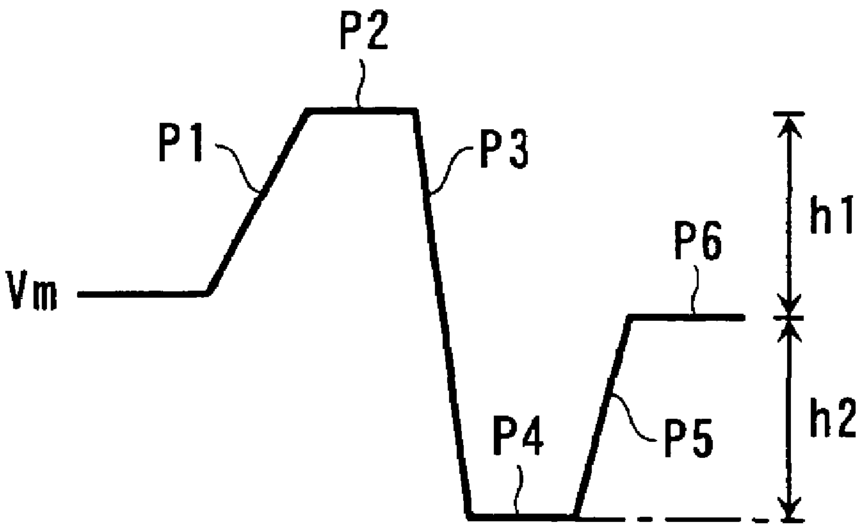
Figure 4B:
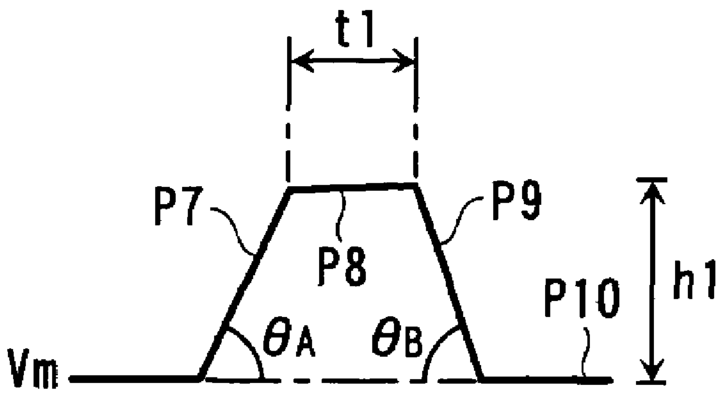

The driving section 82 is made up of a motor driver 96 which drives the respective motors (23, 21, 38) of the X-axis table 3, the Y-axis table 4 and the Θ-axis table 37, the head driver 97 which applies a driving waveform to the piezoelectric elements 62 of the liquid droplet ejection head 20, and a strobe driver 98 which causes the strobe 71 to emit light. As the driving waveforms to be applied to the piezoelectric elements 62 by the head driver 97, there are prepared, as shown in FIGS. 4A and 4B, an “ejection waveform” (FIG. 4A) which is accompanied by the ejection of the function liquid from the nozzle holes 53, and a “micro-vibration waveform” (FIG. 4B) which is not accompanied by the ejection of the function liquid.

In this case, the head driver 97 outputs a trigger signal of the “micro-vibration waveform” to the strobe driver 98. Based on the inputted trigger signal, the strobe driver 98 causes the strobe 71 to emit light. Namely, the strobe driver 98 causes the strobe 71 to emit light synchronously with the application of the “micro-vibration waveform” to the liquid droplet ejection head 20 (details are described later).

The control section 83 includes a CPU 101, a ROM 102, a RAM 103, and a P-CON 104, which are connected to one another through a bus 105. The ROM 102 has a control program area which stores therein a control program and control data to be processed in the CPU 101, and a control data area which stores therein, for example, control data for performing drawing, picturing and the like.

The RAM 103 has, aside from various register groups, mainly an inputted positional data area which stores therein positional data of the liquid droplet ejection head 20 inputted from the host computer 81, a drawing data area which stores therein drawing data for drawing, an image data storage area (so-called image memory) which temporarily stores therein image data taken by the recognition camera 72 and subjected to D/A conversion, and the like. The RAM 103 is used as each kind of work area for control processing.

The P-CON 104 has connected thereto, aside from various drivers for the driving section 82, the above-described function liquid supply mechanism 8, the recognition camera 72 and the like. A logic circuit constituted by a gate array, a custom LSI and the like is incorporated in the P-CON 104. The logic circuit supports the functions of the CPU 101 and deals with interface signals to/from peripheral circuits. Therefore, the P-CON 104 captures various commands from the host computer 81 into the bus 105 with or without processing the commands. At the same time, in conjunction with the CPU 101, the P-CON 104 outputs data and control signals outputted to the bus 105 from the CPU 101 and the like to the driving section 82 with or without processing them. The P-CON 104 also captures data from the recognition camera 72 and outputs image data of the nozzle holes 53 to the image processing section 94 in conjunction with the CPU 101.

Based on the above-described arrangement, and in accordance with the control program within the ROM 102, the CPU 101 inputs various signals, commands, data and the like through the P-CON 104 and processes various data within the RAM 103. Thereafter, the CPU 101 outputs various control signals to the driving section 82 and the image processing section 94 through the P-CON 104, thus controlling the entire liquid droplet ejection apparatus 1.

For example, the CPU 101 controls the liquid droplet ejection head 20 and the X•Y moving mechanism 2 to perform drawing on the substrate W under predetermined drawing conditions and predetermined moving conditions. In a case of conducting an image recognition operation of the nozzle holes 53, the CPU 101 also controls a moving operation of the liquid droplet ejection head 20 by using the X•Y moving mechanism 2 at the position of the image recognition unit 9. At the same time, the CPU 101 controls the application of the micro-vibration waveform to the liquid droplet ejection head 20, as well as light emission of the strobe 71 and image capturing of the recognition camera 72 corresponding to the timing of the application of the micro-vibration waveform.

Here, the image recognition method of the nozzle holes 53 is described in detail with reference to FIGS. 4A and 4B through 7. First of all, two types of driving waveforms shown in FIGS. 4A and 4B are described.

In the "ejection waveform" shown in FIG. 4A, a voltage value starts from a middle voltage Vm, and increases with a predetermined voltage gradient to a maximum voltage which is higher than the middle voltage Vm by h1 (P1). The maximum voltage is maintained for a predetermined period (P2), and then the voltage value decreases with a predetermined voltage gradient to a minimum voltage which is lower than the middle voltage Vm by h2 (P3). By applying to the piezoelectric element 62 a waveform corresponding to the voltage change from the maximum voltage to the minimum voltage (equivalent to h1+h2), the function liquid is ejected from the nozzle holes 53. After the minimum voltage is maintained for a predetermined period of time (P4), the voltage value again increases to the middle voltage Vm again (P5) and is maintained there for a predetermined period of time (P6).

In the "micro-vibration waveform" shown in FIG. 4B, the voltage value starts from a middle voltage Vm and increases with a predetermined voltage gradient $\theta_A$ to a maximum voltage which is higher than the middle voltage by h1 (P7). When the maximum voltage is maintained for a predetermined period of time (t1)(P8), the voltage value decreases with a predetermined voltage gradient $\theta_B$ to the middle voltage Vm (P9) and is maintained at the middle voltage Vm (P10). Even if a waveform corresponding to the voltage change as above (equivalent to h1) is applied to the piezoelectric elements 62, the function liquid is not ejected from the nozzle holes 53 since the pressure fluctuations within the pressure chambers 61 are small. Thus, only micro-vibration of the function liquid occurs in the nozzles 52.

In other words, the "micro-vibration waveform" causes single-period micromotion of the meniscus surfaces of the nozzle holes 53 without accompanying the ejection of the function liquid. Here, the meniscus surfaces are those surfaces of the function liquid which are formed on the ejection side of the nozzle holes 53. In addition, in case where the driving waveform is not applied to the piezoelectric elements 62, the meniscus surface is sometimes formed into a slightly convex shape relative to the nozzle surface 42, as shown in FIG. 5A.

Once the "micro-vibration waveform" is applied, each meniscus surface starts to be pulled into the inside of the nozzle hole 53 (toward the pressure chamber 61) in the process of P7 shown in FIG. 4B (the same applies to the process of P1). Thereafter, in the subsequent process of P8, as shown in FIG. 6A, the meniscus surface is shifted to a predetermined position and the pulled state is maintained. At the same time, the inner circumference portion of the nozzle 53 on its ejection side is exposed. Thereafter, in the process of P9, the meniscus surface is pushed out to the outside (ejection side) of the nozzle hole 53, and is returned to the original position shown in FIG. 5A without accompanying the ejection of the function liquid. In general, the "micro-vibration waveform" allows part of the function liquid which constitutes the meniscus surface at the nozzle hole 53 to flow by micro-vibration, and suppresses an increase in viscosity in the function liquid.

Figure 5A:
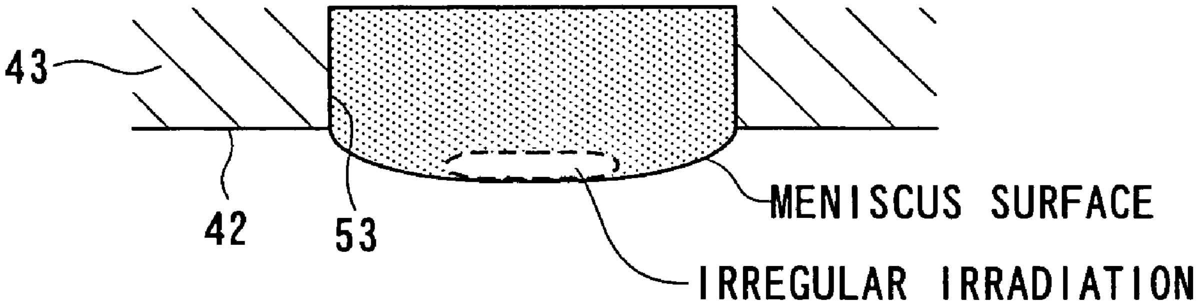
Figure 5B:
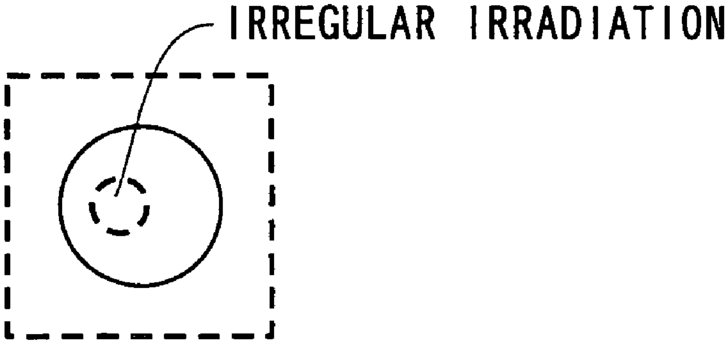
Figure 6A:
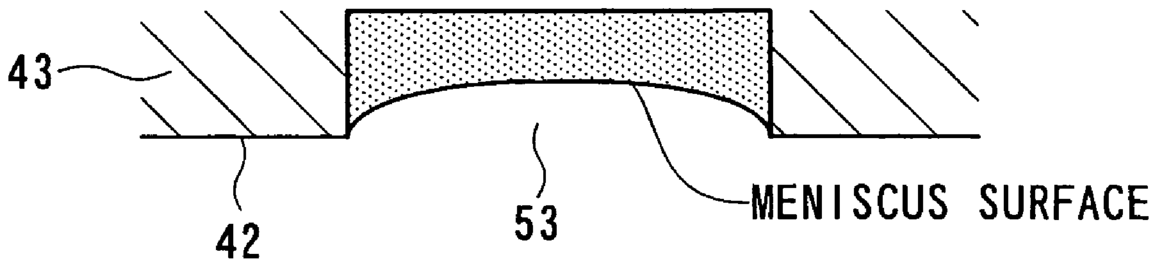

FIGS. 5A and 5B are explanatory views for explaining an influence of the meniscus surface on the image recognition unit 9 in case where the "micro-vibration waveform" is not applied. When the strobe 71 emits light to the nozzle hole 53 without changing the meniscus surface, irregular irradiation occurs on the meniscus surface as shown in FIG. 5A. As a result, an image of the nozzle hole 53 cannot be captured appropriately like in the picturing result of the recognition camera 72 shown in FIG. 5B. Thus, complicated image preprocessing becomes necessary.

Figure 6B:
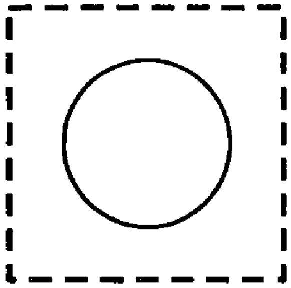

On the other hand, FIGS. 6A and 6B are explanatory views similar to the above in which the "micro-vibration waveform" is applied. As shown in FIG. 6A, the strobe 71 emits light to the nozzle hole 53 in a state in which the meniscus surface is pulled into the inside of the nozzle hole 53, so that irregular irradiation of the meniscus surface can be avoided. Since the influence of the meniscus surface can thus be eliminated, the recognition camera 72 can appropriately capture an image of the nozzle hole 53 as shown in FIG. 6B, and the image processing by the image processing section 94 becomes simple.

Figure 7:
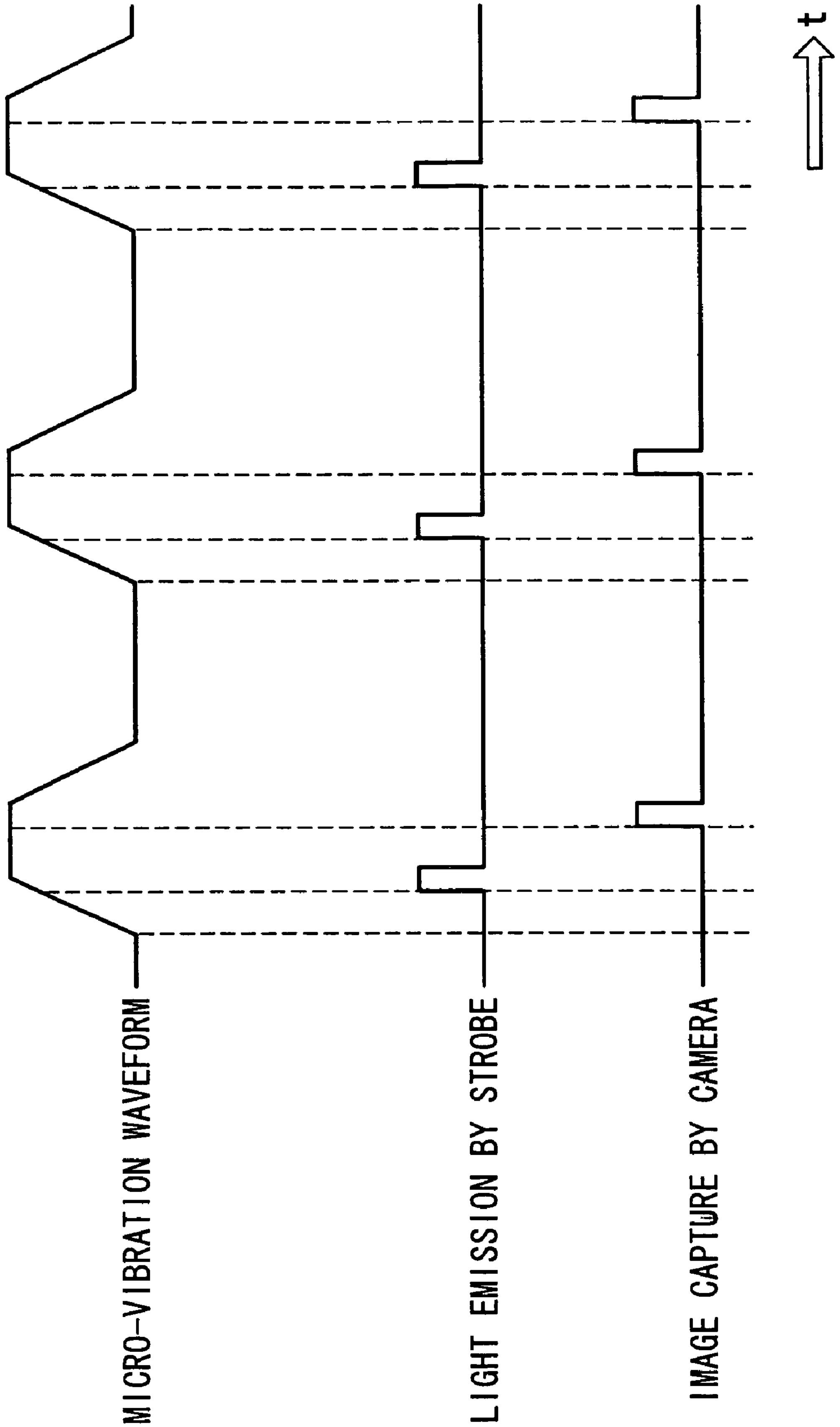
FIG. 7 is a time chart showing a driving operation of the liquid droplet ejection head, a driving operation of a strobe and image capture of a recognition camera.

FIG. 7 is a time chart showing an example of timing of application of the "micro-vibration waveform", light emission of the strobe 71, and image capture, in the image recognition method of the nozzle hole 53. As shown in the figure, a strobe driving signal rises with a predetermined time delay from start of application of the "micro-vibration waveform" to the piezoelectric element 62 (rise), and the strobe 71 emits light in the timing of the signal. While the strobe 71 is emitting light, an image of the nozzle hole 53 is captured by the recognition camera 72.

In this manner, based on the trigger signal of the "micro-vibration waveform" outputted from the head driver 97, the strobe driver 98 causes the strobe 71 to emit light in the timing of pulling the meniscus surface into the inside of the nozzle hole 53 (FIG. 4B: P7), and an image of the nozzle hole 53 is captured by the recognition camera 72 in a state in which the nozzle surface 42 is being pulled as shown by P8 in FIG. 4. In addition, as shown in FIG. 7, application of the "micro-vibration waveform", light emission of the strobe 71 and the like are sequentially performed a plurality of times. Thus, a problem of shortage of light quantity does not occur and an image can be captured more appropriately.

Finally, the image processing section 94 performs image processing of the image of the nozzle hole 53 to measure the coordinates of the central position of the nozzle hole 53 and then to perform comparison operation between the central position and the reference position of the nozzle hole 53 set in advance. Thus, positional deviation of the nozzle hole 53, i.e., the positional deviation of the liquid droplet ejection head 20 can be recognized.

In this manner, according to the image recognition method of the nozzle hole 53 of this embodiment, by utilizing the "micro-vibration waveform", the nozzle holes 53 of the liquid droplet ejection head 20 filled with the function liquid can be appropriately imaged and the image recognition thereof can be well performed. Further, the timing of light emission of the strobe 71 is originated from the application timing of the driving waveform, obtained from the head driver 97. Thus, it is not necessary to create timing data which is exclusively used for light emission of the strobe 71.

When performing the image recognition of the nozzle holes 53, preferably, the liquid droplet ejection head 20 is moved first to the position of the flushing unit to thereby perform a flushing operation (waste ejection of the function liquid by using the head driver 97).

Furthermore, in this embodiment, the nozzle holes 53 are imaged in the timing of pulling the meniscus surfaces into the inside of the nozzle holes 53. However, the nozzle holes 53 may be pictured while the meniscus surfaces are projected from the nozzle holes 53 by using a special driving waveform, such as the "micro-vibration waveform" which is not accompanied by the ejection of the function liquid. In other words, by using the driving waveform by which the positions of the meniscus surfaces at the nozzle holes 53 become always the same and, at the same time, by establishing the image processing process in advance in consideration of a certain irregular irradiation of the meniscus surfaces at those positions, irregular irradiation of the meniscus surfaces can be adequately absorbed during the image processing after picturing, and the nozzle holes 53 can be appropriately recognized.

Figure 8:
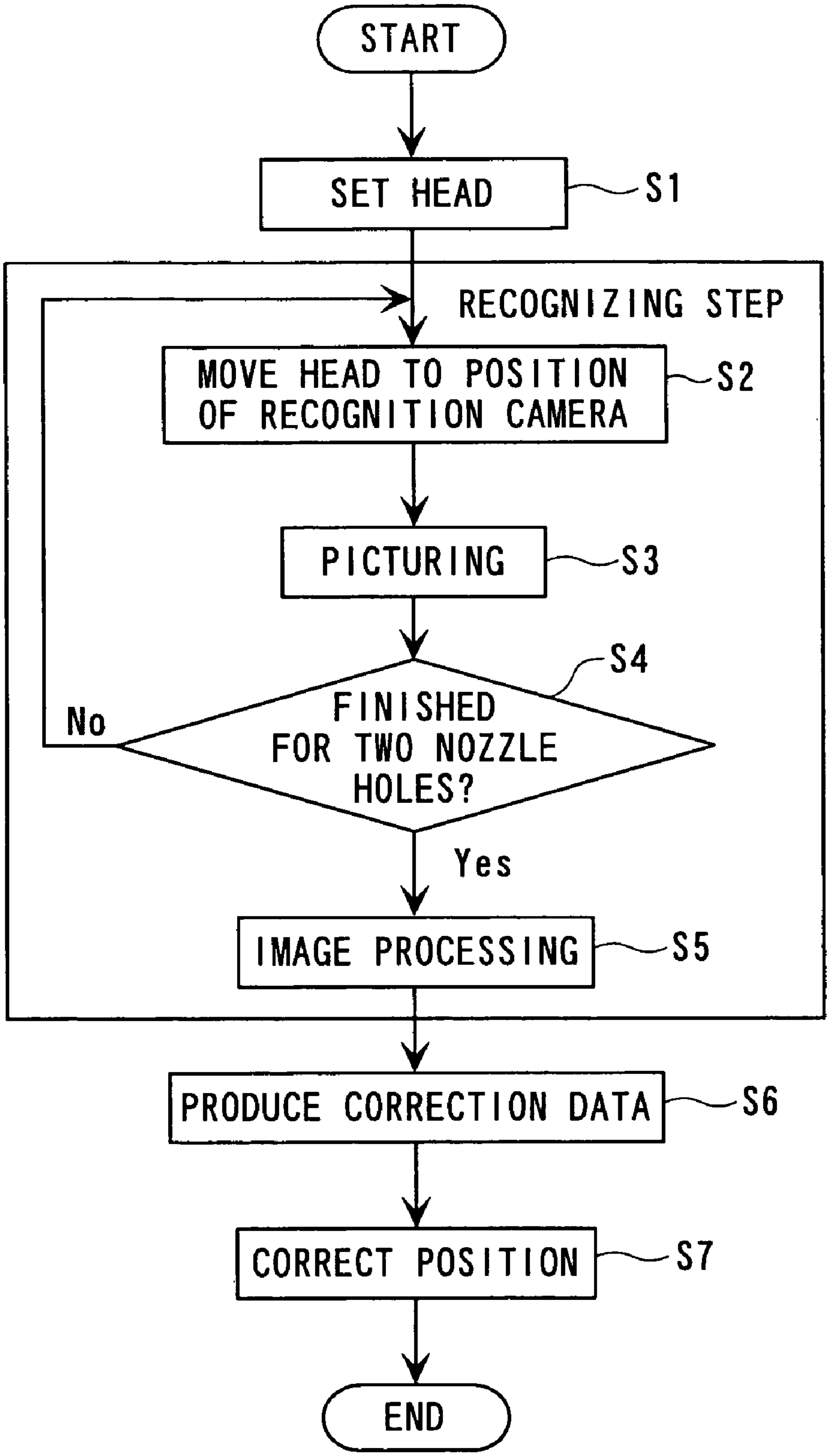
FIG. 8 is a flowchart showing the flow of processing in an image correction method of the liquid droplet ejection head according to the embodiment.

Next, the position correction method of the liquid droplet ejection head 20 by using the above-described image recognition method is described. FIG. 8 is a flowchart showing a flow of a series of processing regarding the position correction method of the liquid droplet ejection head 20 in case where the liquid droplet ejection head 20 is replaced.

Figure 9:
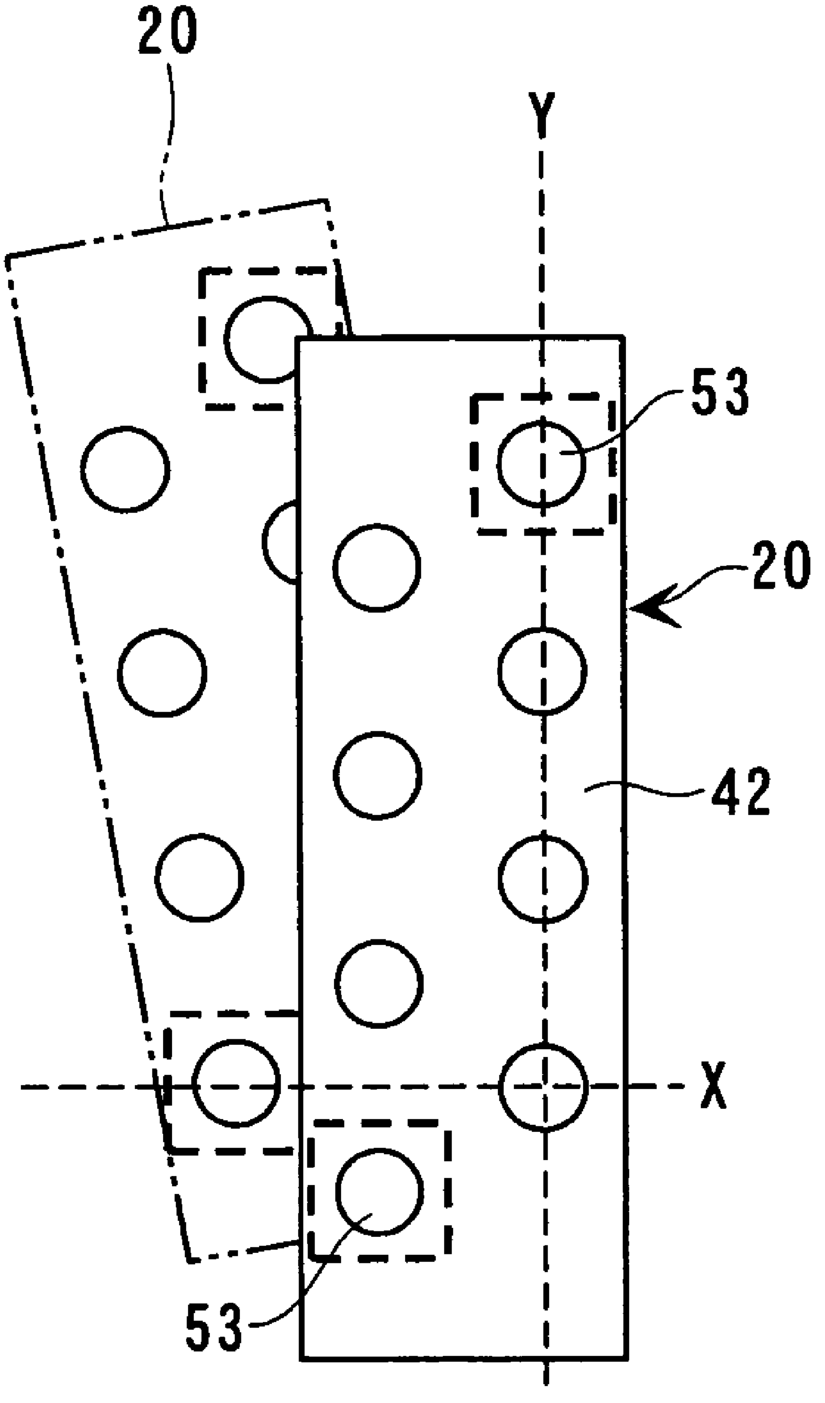
FIG. 9 is an explanatory plan view showing a position of the liquid droplet ejection head.

First of all, in step S1, the liquid droplet ejection head 20 is removed from the sub carriage 36 and a new liquid droplet ejection head 20 is fixed to the sub carriage 36 with screws. Thereafter, the liquid droplet ejection head 20 is filled with the function liquid from the function liquid supply mechanism 8, by using the suction unit (not illustrated) and the like. The position of the liquid droplet ejection head 20 after being filled with the function liquid (after being set in position) may deviate slightly from the reference attaching position in the X-, Y-, and Θ-axis directions (see imaginary line in FIG. 9). Thus, as shown in the figure, the above-described image recognition is performed with the two outermost nozzle holes 53 and 53 serving as the recognition objects.

In concrete, the liquid droplet ejection head 20 is moved to the position of the recognition camera 72 by the Y-axis table 4, and one of the nozzle holes 53, to be made the object of picturing, is caused to fall within (the center of) the field of view of the recognition camera 72 (S2). Herein accordance with the time chart shown in FIG. 7, an image of the nozzle hole 53 is captured (S3). After the decision branch of step S4, (S4: No), the other nozzle hole 53 is processed similarly. Namely, the Y-axis table 4 is driven again, and the other nozzle hole 53 is caused to fall within the field of view of the recognition camera (72 (S2), and an image thereof is captured (S3).

Thereafter, the image of each nozzle hole 53 is processed and positional deviation of the liquid droplet ejection head 20 is recognized (S5). Corrected data regarding the position of the liquid droplet ejection head 20 is then produced (S6). In producing the corrected data in step S6, first of all, displacement data of two nozzle holes 53 in X•Y-axis directions (ΔX and ΔY) are calculated, respectively, and then Θ-axis correction data (ΔΘ) regarding the Θ-axis direction is produced in consideration of the center of rotation of the liquid droplet ejection head 20, based on the two pieces of the displacement data. Thereafter, by factoring in the Θ-axis correction data, X-axis correction data regarding the X-axis direction and Y-axis correction data regarding the Y-axis direction are produced.

In the positional correction in step S7, the Θ-axis moving mechanism is driven based on the Θ-axis correction data to correct the position of the liquid droplet ejection head 20 by rotation. Further, the positional data of the liquid droplet ejection head 20, which is stored in the RAM 103, is corrected based on the X•Y-axis correction data regarding the X•Y-axis directions. Thus, a series of replacement operations including positional correction of the liquid droplet ejection head 20 are finished.

As mentioned above, the positional data of the liquid droplet ejection head 20 is corrected by effectively using the above-described image recognition method, based on the result of image recognition of two nozzle holes 53. Thus, the accuracy of attaching the liquid droplet ejection head 20 to the sub carriage 36 can be further improved. In addition, the liquid droplet ejection head 20 after positional correction can accurately eject and land the function liquid droplets onto target positions on the substrate W.

Next, the nozzle hole inspection method is described with reference to FIGS. 10A to 10C. This nozzle hole inspection method is for picturing the nozzle holes 53 of the liquid droplet ejection head 20 which is filled with the function liquid, and for inspecting the presence or absence of foreign matters (for example, solidified solvent within the function liquid) attached to the nozzle holes 53.

As a preparation operation for the inspection, the liquid droplet ejection head 20 is moved to the position of the suction unit so that suction is applied to the liquid droplet ejection head 20, or the liquid droplet ejection head 20 is moved to the position of the flushing unit so that the flushing operation is performed on the liquid droplet ejection head 20. Upon completion of the preparation, the liquid droplet ejection head 20 is first subjected to the main scanning relative to the inspection area 120 to thereby perform drawing of a test pattern. The inspection area 120 is constituted by an unnecessary portion of the substrate W, for example, a non-drawing area thereof such as an outer edge portion or a portion to be cut off later. It is, however, possible to introduce a target plate, in stead of the substrate W, to the workpiece table 7. Or else, the target plate may also be disposed on the path of movements of the liquid droplet ejection head 20.

Figure 10A:
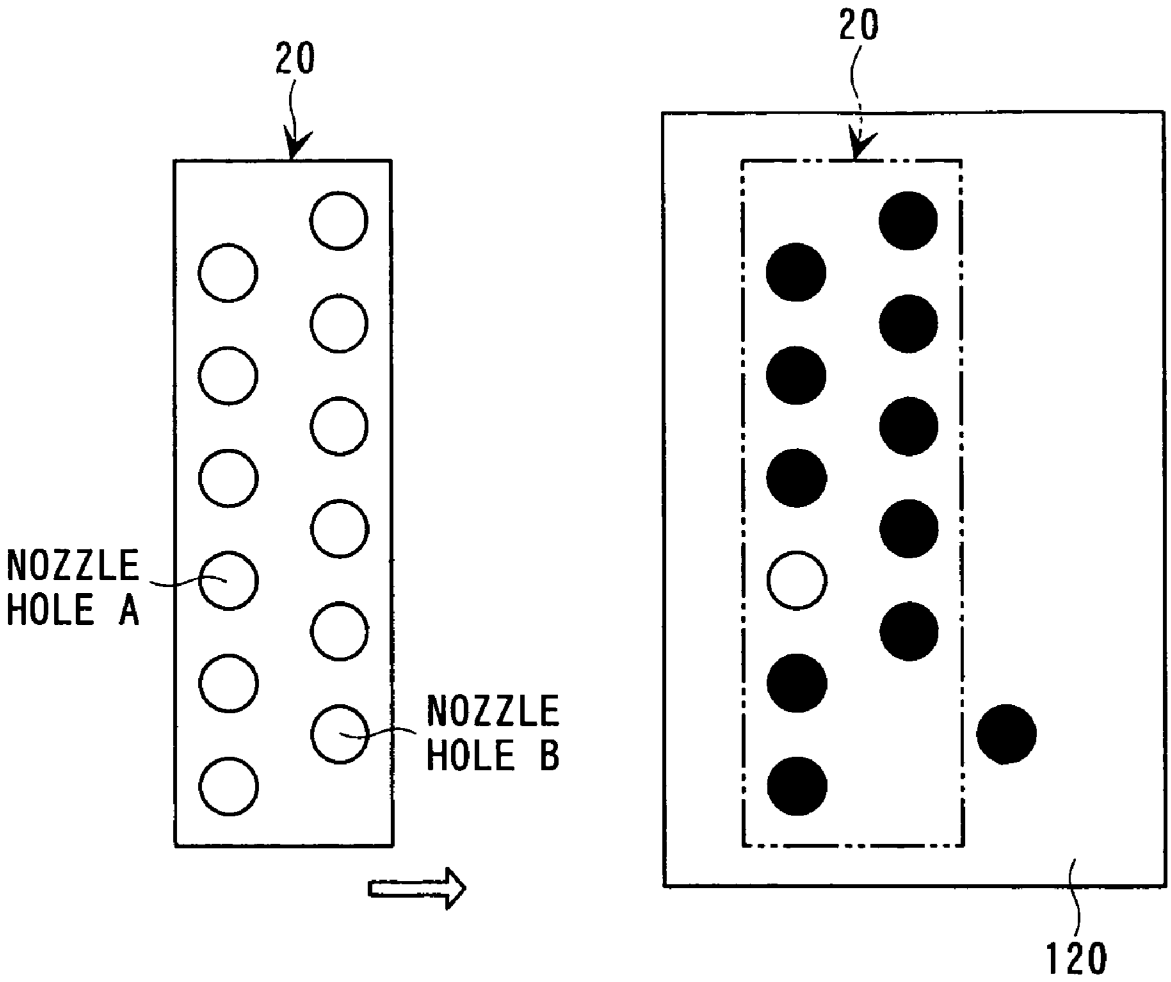
Figure 10B:
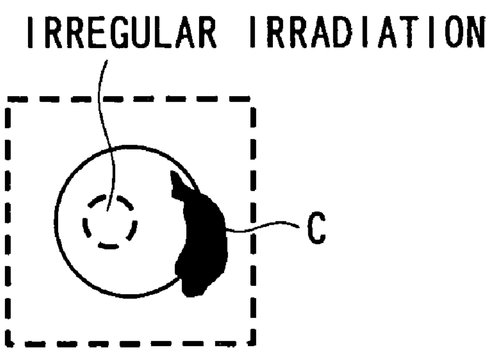
Figure 10C:
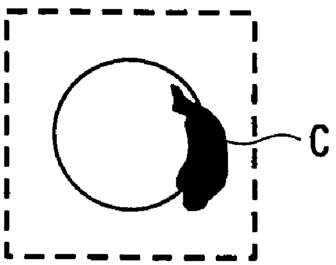

FIG. 10A shows an ejection result of the ejection operation of the function liquid droplets from all nozzle holes 53 of the liquid droplet ejection head 20 onto the inspection area 120. A black circle "●" in the figure represents a dot in the inspection area 120, formed by the ejection of the function liquid from each nozzle hole 53. A white circle "○" represents non-ejection of the function liquid from the nozzle hole 53. In this case, based on the result of ejection in the inspection area 120, a nozzle hole A corresponding to the white circle "○", and a nozzle hole B corresponding to the black circle "●" which is away from the reference line are specified as nozzle holes which are doubtful of poor ejection.

In the next inspection operation, the nozzle holes A and B with poor ejection are pictured by the above-described image recognition unit 9 as objects for inspection. Namely, the liquid droplet ejection head 20 is moved to the position of the image recognition unit 9, the "micro-vibration waveform" is applied, and the nozzle holes A and B are pictured at the timing of pulling the meniscus surfaces to the inside of the nozzle holes. Thus, the irregular irradiation of the meniscus surfaces does not occur (see FIG. 10B). In addition, it is possible to include in the pictured images those ejection-side portions of the nozzle holes 53 which are exposed by the inward pulling of the meniscus surfaces as shown in FIG. 10C. Hence, close-up of the foreign matter C is feasible irrespective of irregular irradiation.

Therefore, by observing the pictured images by image processing or by an operator, presence or absence of foreign matters C attached to the portions of the nozzle holes 53 on the ejection side thereof can be inspected easily and effectively. A factor of slanted flight of the function liquid droplet as in the case of the nozzle hole B is generally known to be due to the foreign matter C shown in FIGS. 10B and 10C. In addition, increase in viscosity of the function liquid in the nozzle 52 is considered to be the cause of poor ejection of the function liquid droplet as in the case of the nozzle hole A.

In case where the foreign matter C or poor ejection is found as above, the liquid droplet ejection head 20 is moved to the position of the suction unit and suction processing is performed on the liquid droplet ejection head 20, to thereby eliminating these deficiencies. Alternatively, the liquid droplet ejection head 20 may be moved to the position of the flushing unit to subject the liquid droplet ejection head 20 to the flushing operation. In case the nozzle holes 53 are determined to be poor-ejection nozzles even after these recovery processes are performed, the nozzle holes 53 in question may be set so as not to eject the function liquid, or the liquid droplet ejection head 20 may be replaced.

The liquid droplet ejection apparatus 1 of this embodiment can be used for manufacturing various electro-optical devices by using the function liquids made from various materials. Namely, the liquid droplet ejection apparatus 1 can be applied to the manufacturing of a liquid crystal display device, an organic EL device, a PDP device, an electrophoretic display device and the like. The liquid droplet ejection apparatus 1 can also be applied to the manufacturing of a color filter used in a liquid crystal display device and the like. Further, as other electro-optical devices, devices in which metal wiring, a lens, resist, a light diffuser and the like is formed can be considered. Furthermore, it is possible to provide electronic equipment with the above electro-optical device, for example, a cellular phone on which a flat panel display is mounted.

A manufacturing method using the liquid droplet ejection apparatus 1 is described by taking as examples methods of manufacturing a liquid crystal display device and an organic EL device. Methods of manufacturing other devices are also described briefly.

Figure 11:
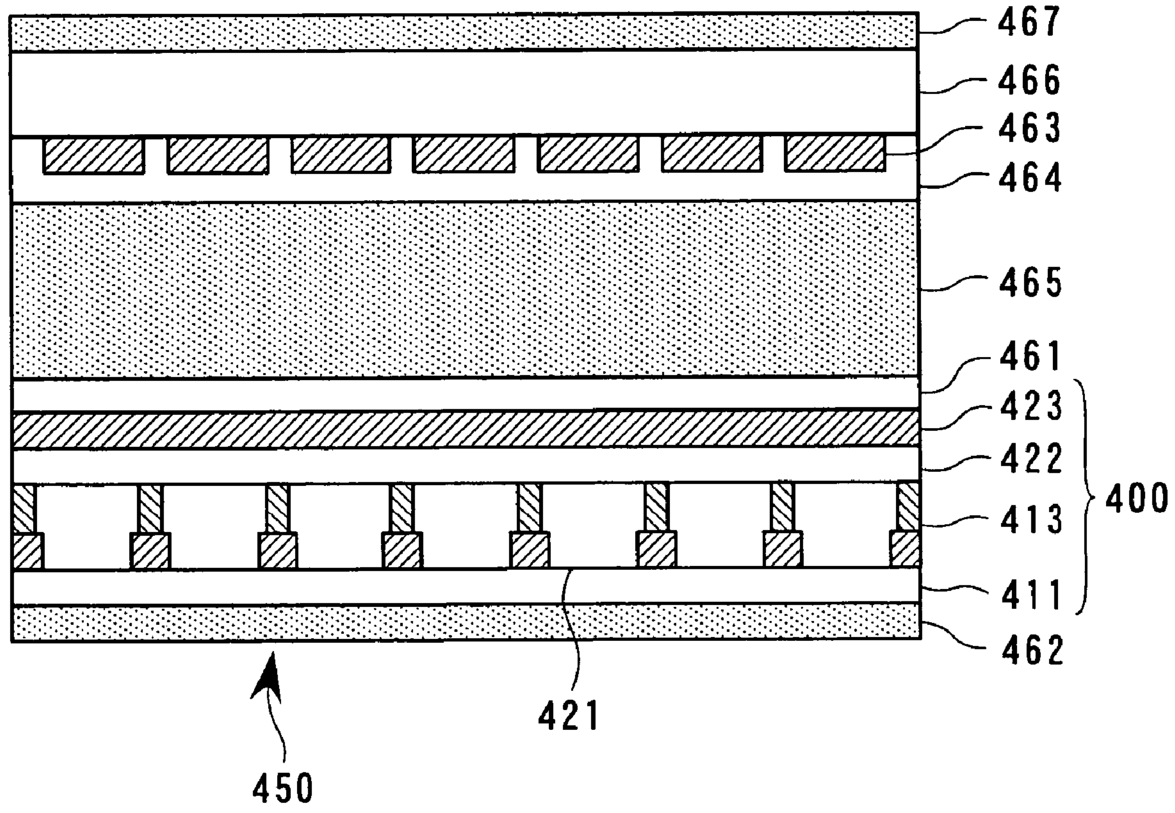
FIG. 11 is a cross sectional view of a liquid crystal display device manufactured by the liquid droplet ejection apparatus of the embodiment.

FIG. 11 is a cross sectional view of a liquid crystal display device. As shown in the figure, the liquid crystal display device 450 is constituted by combining a color filter 400 and an opposing substrate 466 between upper and lower polarizers 462, 467, and filling a liquid crystal composition 465 between the color filter 400 and the opposing substrate 466. Further, alignment films 461; 464 are formed between the color filter 400 and the opposing substrate 466, and thin-film transistor (TFT) elements (not illustrated) and pixel electrodes 463 are formed in a matrix form on the inner surface of the opposing substrate 466.

The color filter 400 includes pixels (filter elements) arrayed in a matrix form. The boundaries between the pixels are partitioned by banks 413. A filter material (function liquid) of any one of red (R), green (G), and blue (B) is introduced into each pixel. Namely, the color filter 400 includes translucent substrate 411 (workpiece W) and the light-shielding banks 413. The portions where banks 413 are not formed (removed) constitute the above-described pixels, and the filter materials of the respective colors introduced into the pixels constitute colored layers 421. An overcoat layer 422 and an electrode layer 423 are formed on the upper surfaces of the banks 413 and the colored layers 421.

In the liquid droplet ejection apparatus 1 of this embodiment, the liquid droplet ejection head 20 selectively ejects the function liquid of each of R, G and B colors into the pixels formed by partitioning with the banks 413, for each area where the colored layer is formed. Thereafter, the applied function liquid is dried, thus obtaining the colored layers 421 which are deposition portions. Further, the liquid liquid droplet ejection apparatus 1 forms various deposition portions such as overcoat layer 422 by means of the liquid droplet ejection head 20.

Figure 12:
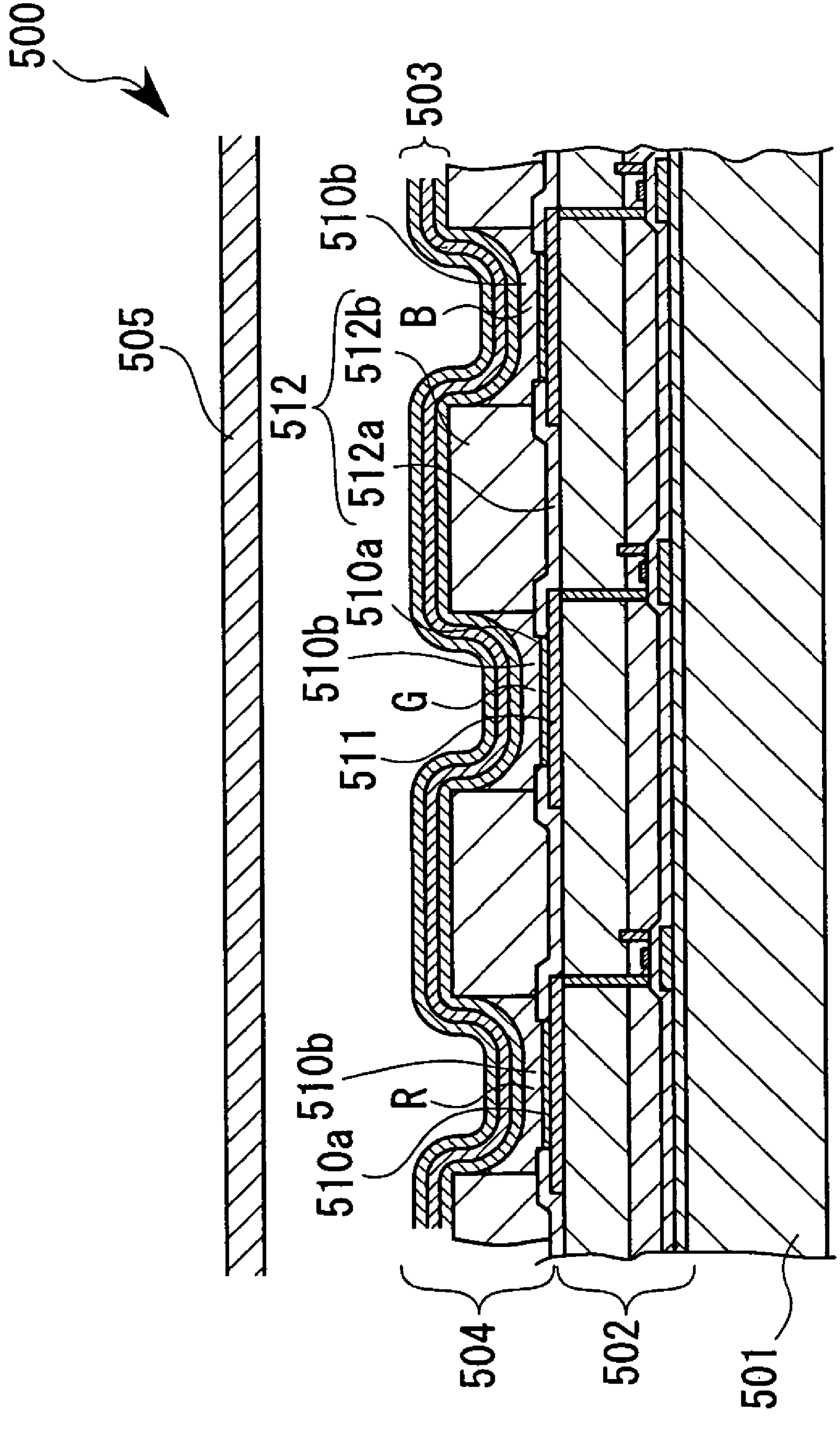
FIG. 12 is a cross-sectional view of an organic EL device manufactured by the liquid droplet ejection apparatus of the embodiment.

Similarly, an organic EL device and the method of manufacturing the same are described with reference to FIG. 12. As shown in the figure, in the organic EL device 500, a circuit element portion 502 is stacked on a glass substrate 501 (workpiece W), and organic EL elements 504, constituting a main part, are stacked on the circuit element portion 502. In addition, a sealing substrate 505 is formed on the organic EL element 504, leaving a space therebetween for an inert gas.

In the organic EL device 504, each bank 512 is formed by an inorganic bank layer 512*a* and an organic bank layer 512*b* which is layered thereon. These banks 512 define pixels in a matrix form. In each pixel, a pixel electrode 511, a luminescent layer 510*b* of any one of R, G and B, and a hole injection/transport layer 510*a* are stacked from the bottom. The pixels are entirely covered with a counter electrode 503 in which a plurality of thin films made of Ca, Al and the like are stacked.

The liquid droplet ejection apparatus 1 of this embodiment forms deposition portions including the respective luminescent layers 510*b* of R, G and B, and the hole injection/transport layers 510*a*. Further, after forming the hole injection/transport layers 510*a*, the liquid droplet ejection apparatus 1 forms the counter electrode 503 by using a liquid metal material of Ca, Al and the like as the function liquid to be introduced into the liquid droplet ejection head 20.

In a method of manufacturing a PDP device, fluorescent materials of R, G and B colors are respectively introduced into a plurality of liquid droplet ejection heads 20. The plurality of liquid droplet ejection heads 20 are then moved in the main scanning direction and the sub scanning direction, while selectively ejecting fluorescent materials, thus forming phosphor in each of multiple recesses on a rear substrate.

In a method of manufacturing an electrophoretic display device, electrophoretic materials of the respective colors are introduced into the plurality of liquid droplet ejection heads 20. The plurality of liquid droplet ejection heads 20 are then moved in the main scanning direction and the sub scanning direction, while selectively ejecting the electrophoretic materials, thus forming phosphor in each of multiple recesses on an electrode. It is preferred that the electrophoretic materials, each being made of electrically charged particles and dye, be microcapsulated.

In a metal wiring forming method, a liquid metal material is introduced to the plurality of liquid droplet ejection heads 20. The plurality of liquid droplet ejection heads 20 are then moved in the main scanning direction and the sub scanning direction, while selectively ejecting the liquid metal material, thus forming metal wiring on a substrate. This metal wiring forming method may be applied, for example, to metal wiring connecting a driver and each electrode in the above-described liquid crystal display device, and metal wiring connecting TFT and the like and each electrode in the above-described organic EL device, whereby these devices can be manufactured. Needless to say, this method can be applied not only to a flat panel display of this kind, but also to a general semiconductor manufacturing technology.

In a lens forming method, a lens material is introduced into the plurality of liquid droplet ejection heads 20. The plurality of liquid droplet ejection heads 20 are then moved in the main scanning direction and the sub scanning direction, while selectively ejecting the lens material, thus forming multiple microlenses on a transparent substrate. This method can be applied, for example, to manufacturing of a device for beam convergence in the foregoing FED device. This method can also be applied to a technology for manufacturing various optical devices.

In a method of manufacturing a lens, a translucent coating material is introduced into the plurality of liquid droplet ejection heads 20. The plurality of liquid droplet ejection heads 20 are then moved in the main scanning direction and the sub scanning direction while selectively ejecting the coating material, thus forming a coating film on each lens surface.

In a resist forming method, a resist material is introduced into the plurality of liquid droplet ejection heads 20. The plurality of liquid droplet ejection heads 20 are moved in the main scanning direction and the sub scanning direction, while selectively ejecting the resist material, thus forming photoresist of an arbitrary shape on a substrate. This method can be widely applied, for example, not only to the formation of banks in various display devices described above, but also to the coating of photoresist in a photolithography method which is a predominant method in semiconductor manufacturing technologies.

In a light diffuser forming method, a light diffusing material is introduced into the plurality of liquid droplet ejection heads 20. The plurality of liquid droplet ejection heads 20 are moved in the main scanning direction and the sub scanning direction while selectively ejecting the light diffusing material. Thus, a multiplicity of light diffusers are formed on a substrate. In this case, needless to say, this method can also be used for manufacturing various optical devices.

According to the method of, and apparatus for, recognizing the hole image of this invention, the nozzle holes are pictured when the meniscus surfaces of the nozzle holes are shifted to predetermined positions by the driving waveform applied to the liquid droplet ejection head. Thus, the nozzle holes can be always pictured under the same conditions. Therefore, in the state in which the liquid droplet ejection head is filled with the function liquid, the accuracy of image recognition of the nozzle holes can be improved irrespective of a moving operation of the liquid droplet ejection head and the like. At the same time, processes of image processing can be simplified.

According to the method of inspecting the nozzle hole of this invention, the driving waveform for pulling the meniscus surfaces of the nozzle holes to the inside thereof is applied to the liquid droplet ejection head, and the nozzle holes are pictured in the timing of application of the driving waveform. Thus, those portions of the nozzle holes which are on the ejection side thereof can be captured as images. Therefore, by observation and the like of the images, presence or absence of foreign matters attached to those portions of the nozzle holes which are on the ejection side thereof can be inspected easily and appropriately.

According to the method of correcting the position of the liquid droplet ejection head of this invention, positional data of the liquid droplet ejection head is corrected by using the above-described method of recognizing the nozzle hole image. Thus, the position of the liquid droplet ejection head can be corrected highly accurately and quickly.

According to the liquid droplet ejection apparatus of this invention, the position of the liquid droplet ejection head is corrected by using the above-described nozzle hole image recognition method. Thus, the function liquid ejected from the liquid droplet ejection head can be accurately landed on target positions on a workpiece.

According to the method of manufacturing an electro-optical device, the electro-optical device, and the electronic equipment of this invention, they are manufactured by using the liquid droplet ejection apparatus which realizes landing of the function liquid with good accuracy. Thus, various electro-optical devices and electronic equipment with high quality and high reliability can be provided.

What is claimed is:

1. A method of recognizing an image of a nozzle hole, comprising:

causing a strobe to intermittently emit light to a nozzle hole of a liquid droplet ejection head in a state of being filled with a function liquid to perform image recognition thereof; and synchronously with the intermittent emitting of light from the strobe, applying a driving waveform to the liquid droplet ejection head, the driving waveform causing single-period micromotion of a meniscus surface of the nozzle hole;

wherein the image recognition is only performed when the strobe emits light and the strobe only emits light at a timing in which the meniscus surface is pulled into an inside of the nozzle hole due to the driving waveform.

2. A method of correcting a position of a liquid droplet ejection head, comprising:

a step of recognizing an image of a position of a nozzle hole of a liquid droplet ejection head by using the method of recognizing an image of a nozzle hole according to claim 1; and a step of correcting positional data of the liquid droplet ejection head based on a result of recognition in the recognizing step.

3. A method of inspecting a nozzle hole comprising:

causing a strobe to intermittently emit light to a nozzle hole of a liquid droplet ejection head in a state of being filled with a function liquid to check or foreign matter adhered; and applying a driving waveform to the liquid droplet ejection head to pull a meniscus surface of the nozzle hole to an inside thereof, wherein the check for foreign matter is only performed when the strobe emits light and the strobe only emits light at a timing in which the meniscus surface is pulled into the inside of the nozzle hole due to the driving waveform.

4. The method of inspecting a nozzle hole according to claim 3, wherein the liquid droplet ejection head has a plurality of the nozzle holes, and the method further comprises:

a step of ejecting, for inspection, a function liquid from all nozzle holes of the liquid droplet ejection head toward an inspection area; and a step of determining a defective nozzle by identifying one of the nozzle holes with poor ejection, based on a result of ejection in the inspection area, wherein, after the step of determining the defective nozzle, the one nozzle hole with poor ejection is pictured as an object of inspection, by applying the driving waveform to the liquid droplet ejection head.

* * * * *

UNITED STATES PATENT AND TRADEMARK OFFICE

CERTIFICATE OF CORRECTION

PATENT NO. : 7,592,032 B2
APPLICATION NO. : 10/789934
DATED : September 22, 2009
INVENTOR(S) : Yoichi Miyasaka It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1441 days.

Signed and Sealed this

Twenty-first Day of September, 2010

David J. Kappos

*Director of the United States Patent and Trademark Office*